United States Patent
Choi et al.

(10) Patent No.: US 11,993,845 B2
(45) Date of Patent: May 28, 2024

(54) HIGH SELECTIVITY ATOMIC LAYER DEPOSITION PROCESS

(71) Applicant: Applied Materials, Inc., Santa Clara, CA (US)

(72) Inventors: Jong Choi, San Diego, CA (US); Christopher Ahles, San Diego, CA (US); Andrew C. Kummel, San Diego, CA (US); Keith Tatseun Wong, Los Gatos, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 702 days.

(21) Appl. No.: 16/809,318

(22) Filed: Mar. 4, 2020

(65) Prior Publication Data
US 2020/0283898 A1   Sep. 10, 2020

Related U.S. Application Data (60) Provisional application No. 62/813,911, filed on Mar. 5, 2019.

(51) Int. Cl.
| | |
|---|---|
| C23C 16/455 | (2006.01) |
| C23C 16/40 | (2006.01) |
| C23C 16/458 | (2006.01) |
| H01L 21/02 | (2006.01) |
| H01L 21/285 | (2006.01) |

(52) U.S. Cl.
CPC ...... C23C 16/45553 (2013.01); C23C 16/401 (2013.01); C23C 16/4583 (2013.01); H01L 21/02142 (2013.01); H01L 21/0228 (2013.01); H01L 21/28518 (2013.01); *H01L 21/02211* (2013.01)

(58) Field of Classification Search
CPC ........ H01L 21/02142; H01L 21/02211; H01L 21/0228; H01L 21/28518; C23C 16/40; C23C 16/45553; C23C 16/4583
See application file for complete search history.

(56) References Cited

U.S. PATENT DOCUMENTS

| | | |
|---|---|---|
| 7,964,505 B2 | 6/2011 | Khandelwal et al. |
| 9,716,012 B2 | 7/2017 | Thompson et al. |
| 2003/0023338 A1 | 1/2003 | Chin et al. |
| 2004/0043569 A1* | 3/2004 | Ahn ............ H01L 29/513 257/E21.654 |

(Continued)

FOREIGN PATENT DOCUMENTS

WO    2012033717 A2    3/2012

*Primary Examiner* — Brook Kebede
(74) *Attorney, Agent, or Firm* — Patterson + Sheridan, LLP (57) ABSTRACT

Methods for depositing a metal containing material formed on a certain material of a substrate using an atomic layer deposition process for semiconductor applications are provided. In one embodiment, a method of forming a metal containing material on a substrate comprises pulsing a first gas precursor comprising a metal containing precursor to a surface of a substrate, pulsing a second gas precursor comprising a silicon containing precursor to the surface of the substrate, forming a metal containing material selectively on a first material of the substrate, and thermal annealing the metal containing material formed on the substrate.

18 Claims, 7 Drawing Sheets

(56) References Cited

U.S. PATENT DOCUMENTS

| | | | |
|---|---|---|---|
| 2005/0059259 A1* | 3/2005 | O'Meara | H01L 21/02304 438/785 |
| 2009/0004850 A1* | 1/2009 | Ganguli | C23C 16/45523 438/655 |
| 2009/0084317 A1 | 4/2009 | Wu et al. | |
| 2015/0021672 A1* | 1/2015 | Chuang | H01L 29/6653 257/288 |
| 2016/0225866 A1* | 8/2016 | Peri | H01L 27/11575 |
| 2017/0140983 A1 | 5/2017 | Leschkies et al. | |

* cited by examiner

HIGH SELECTIVITY ATOMIC LAYER DEPOSITION PROCESS

CROSS-REFERENCE TO RELATED APPLICATIONS

This application claims benefit of U.S. Provisional Application Ser. No. 62/813,911, filed Mar. 5, 2020, of which is incorporated by reference in its entirety.

BACKGROUND

Field

Embodiments generally relate to methods for selectively forming a metal containing material on certain locations of a semiconductor substrate. More specifically, embodiments relate to methods for selectively forming a metal containing material on certain locations of a semiconductor substrate by an atomic layer deposition process for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the geometry limits of the structures used to form semiconductor devices are pushed against technology limits, the need for accurate formation with desired materials for the manufacture of structures having small critical dimensions and high aspect ratios and structures with certain desired materials has become increasingly difficult to satisfy. The conventional selective deposition process often cannot efficiently be confined and formed at the designated small dimensions on the substrate, resulting in undesired materials formed on the undesired locations of the substrate. Thus, the materials would be globally formed on the entire surface of such substrate without selectivity or be grown on the undesired locations of the substrate, thus making the selective deposition process difficult to achieve or even result in cross contamination on the substrate surface.

Thus, there is a need for improved methods for a deposition process suitable for advanced generation of semiconductor applications.

SUMMARY

Methods for depositing a metal containing material formed on a certain material of a substrate using an atomic layer deposition process for semiconductor applications are provided. In one embodiment, a method of forming a metal containing material on a substrate comprises pulsing a first gas precursor comprising a metal containing precursor to a surface of a substrate, pulsing a second gas precursor comprising a silicon containing precursor to the surface of the substrate, forming a metal containing material selectively on a first material of the substrate, and thermal annealing the metal containing material formed on the substrate.

In another embodiment, a method of forming a metal containing material on a substrate includes performing an atomic layer deposition process by alternatively pulsing a first and a second gas precursor to a surface of a substrate comprising a first and a second material, wherein the first gas precursor comprises a metal containing gas, selectively forming a metal containing material on the first material of the substrate, and thermally annealing the metal containing material In yet another embodiment, a method of forming a metal containing material on a substrate includes selectively forming a metal containing layer on a silicon material on a substrate than on an insulating material on the substrate by an atomic layer deposition process, and maintaining a substrate temperature less than 150 degrees Celsius while performing the atomic layer deposition process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for selectively depositing a metal containing material at a certain location on a structure formed on the substrate are provided. The structure may include a back-end structure, front-end structure, interconnection structure, passivation structure, fin structure, a gate structure, a contact structure, or any suitable structure in semiconductor devices. In one example, an atomic layer deposition process may be utilized to form a metal containing material on a certain surface, e.g., selectively form a certain type of a material on a substrate comprising two or more different surfaces made from different materials. In one example, a molybdenum containing material is formed by an atomic layer deposition (ALD) process. The ALD process utilizes at least two different precursors during the atomic layer deposition to form the molybdenum containing material selectively formed on a silicon surface at a temperature less than 150 degrees Celsius.

Figure 1:
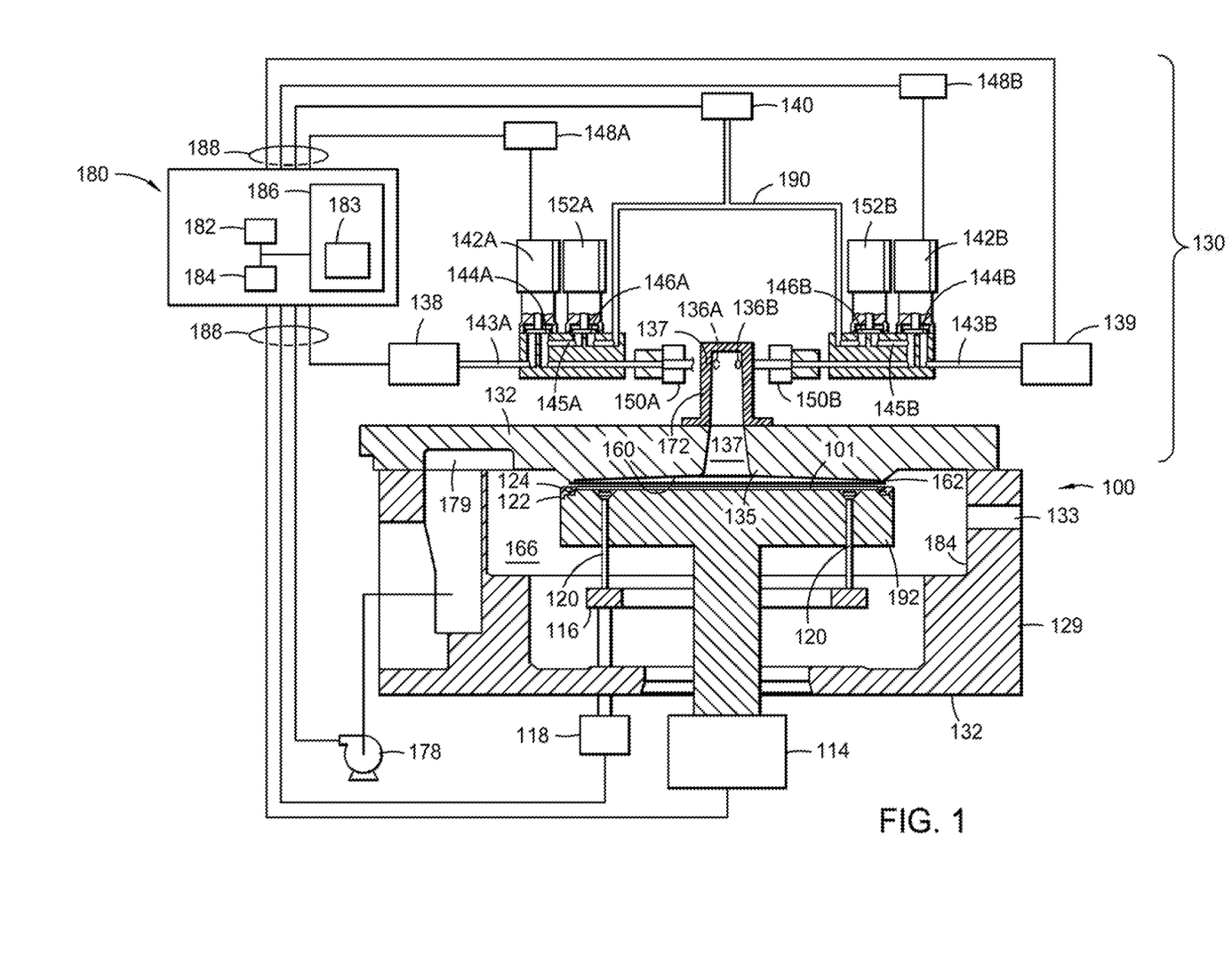
FIG. 1 depicts an apparatus that may be utilized to perform an atomic layer deposition (ALD) process.

FIG. 1 is a schematic cross-sectional view of one embodiment of an atomic layer deposition (ALD) processing chamber 100. The ALD processing chamber 100 includes a gas delivery apparatus 130 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 100 may also be adapted for other deposition techniques along with lithography process.

The chamber 100 comprises a chamber body 129 having sidewalls 131 and a bottom 132. A slit valve tunnel 133 formed through the chamber body 129 provides access for a robot (not shown) to deliver and retrieve a substrate 101, such as a 200 mm, 300 mm or 450 mm semiconductor substrate or a glass substrate, from the chamber 100.

A substrate support 192 is disposed in the chamber 100 and supports the substrate 101 during processing. The substrate support 192 is mounted to a lift 114 to raise and lower the substrate support 192 and the substrate 338 disposed thereon. A lift plate 116 is connected to a lift plate actuator 118 that controls the elevation of the lift plate 116. The lift plate 116 may be raised and lowered to raise and lower pins 120 movably disposed through the substrate support 192. The pins 120 are utilized to raise and lower the substrate 101 over the surface of the substrate support 192. The substrate support 192 may include a vacuum chuck, an electrostatic chuck, or a clamp ring for securing the substrate 101 to the surface of the substrate support 192 during processing.

The substrate support 192 may be heated to heat the substrate 101 disposed thereon. For example, the substrate support 192 may be heated using an embedded heating element, such as a resistive heater, or may be heated using radiant heat, such as heating lamps disposed above the substrate support 192. A purge ring 122 may be disposed on the substrate support 192 to define a purge channel 124 which provides a purge gas to a peripheral portion of the substrate 101 to prevent deposition thereon.

A gas delivery apparatus 130 is disposed at an upper portion of the chamber body 129 to provide a gas, such as a process gas and/or a purge gas, to the chamber 100. A pumping system 178 is in communication with a pumping channel 179 to evacuate any desired gases from the chamber 100 and to help maintain a desired pressure or a desired pressure range inside a pumping zone 166 of the chamber 100.

In one embodiment, the gas delivery apparatus 130 comprises a chamber lid 132. The chamber lid 132 includes an expanding channel 137 extending from a central portion of the chamber lid 132 and a bottom surface 160 extending from the expanding channel 137 to a peripheral portion of the chamber lid 132. The bottom surface 160 is sized and shaped to substantially cover the substrate 101 disposed on the substrate support 192. The chamber lid 132 may have a choke 162 at a peripheral portion of the chamber lid 132 adjacent the periphery of the substrate 101. The cap portion 172 includes a portion of the expanding channel 137 and gas inlets 136A, 136B. The expanding channel 137 has gas inlets 136A, 136B to provide gas flows from two similar valves 142A, 142B. The gas flows from the valves 142A, 142B may be provided together and/or separately.

In one configuration, valve 142A and valve 142B are coupled to separate reactant gas sources, but are coupled to the same purge gas source. For example, valve 142A is coupled to a reactant gas source 138 and valve 142B is coupled to reactant gas source 139, which both valves 142A, 142B are coupled to purge a gas source 140. Each valve 142A, 142B includes a delivery line 143A, 143B having a valve seat assembly 144A, 144B and includes a purge line 145A, 145B having a valve seat assembly 146A, 146B. The delivery line 143A, 143B is in communication with the reactant gas source 138, 139 and is in communication with the gas inlet 137A, 137B of the expanding channel 190. The valve seat assembly 144A, 144B of the delivery line 143A, 143B controls the flow of the reactant gas from the reactant gas source 138, 139 to the expanding channel 190. The purge line 145A, 145B is in communication with the purge gas source 140 and intersects the delivery line 143A, 143B downstream of the valve seat assembly 144A, 144B of the delivery line 143A, 143B. The valve seat assembly 146A, 146B of the purge line 145A, 145B controls the flow of the purge gas from the purge gas source 140 to the delivery line 143A, 143B. If a carrier gas is used to deliver reactant gases from the reactant gas source 638, 639, the same gas may be used as a carrier gas and a purge gas (i.e., an argon gas may be used as both a carrier gas and a purge gas).

Each valve 142A, 142B may be a zero dead volume valve to enable flushing of a reactant gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned as slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., not necessary zero dead volume.) Each valve 142A, 142B may be adapted to provide a combined gas flow and/or separate gas flow of the reactant gas from the sources 138, 139 and the purge gas from the source 140. The pulses of the purge gas may be provided by opening and closing a diaphragm of the valve seat assembly 146A of the purge line 145A. The pulses of the reactant gas from the reactant gas source 138 may be provided by opening and closing the valve seat assembly 144A of the delivery line 143A.

A control unit 180 may be coupled to the chamber 100 to control processing conditions. The control unit 180 comprises a central processing unit (CPU) 182, support circuitry 184, and memory 186 containing associated control software 183. The control unit 180 may be one of any form of general purpose computer processors that can be used in an industrial setting for controlling various chambers and sub-processors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 100. The control unit 180 may be coupled to another controller that is located adjacent individual chamber components, such as the programmable logic controllers 148A, 148B of the valves 142A, 142B. Bi-directional communications between the control unit 180 and various other components of the chamber 100 are handled through numerous signal cables collectively referred to as signal buses 188, some of which are illustrated in FIG. 1. In addition to the control of process gases and purge gases from gas sources 138, 139, 140 and from the programmable logic controllers 148A, 148B of the valves 142A, 142B, the control unit 180 may be configured to be responsible for automated control of other activities used in substrate processing, such as substrate transport, temperature control, chamber evacuation, among other activities, some of which are described elsewhere herein.

Figure 2:
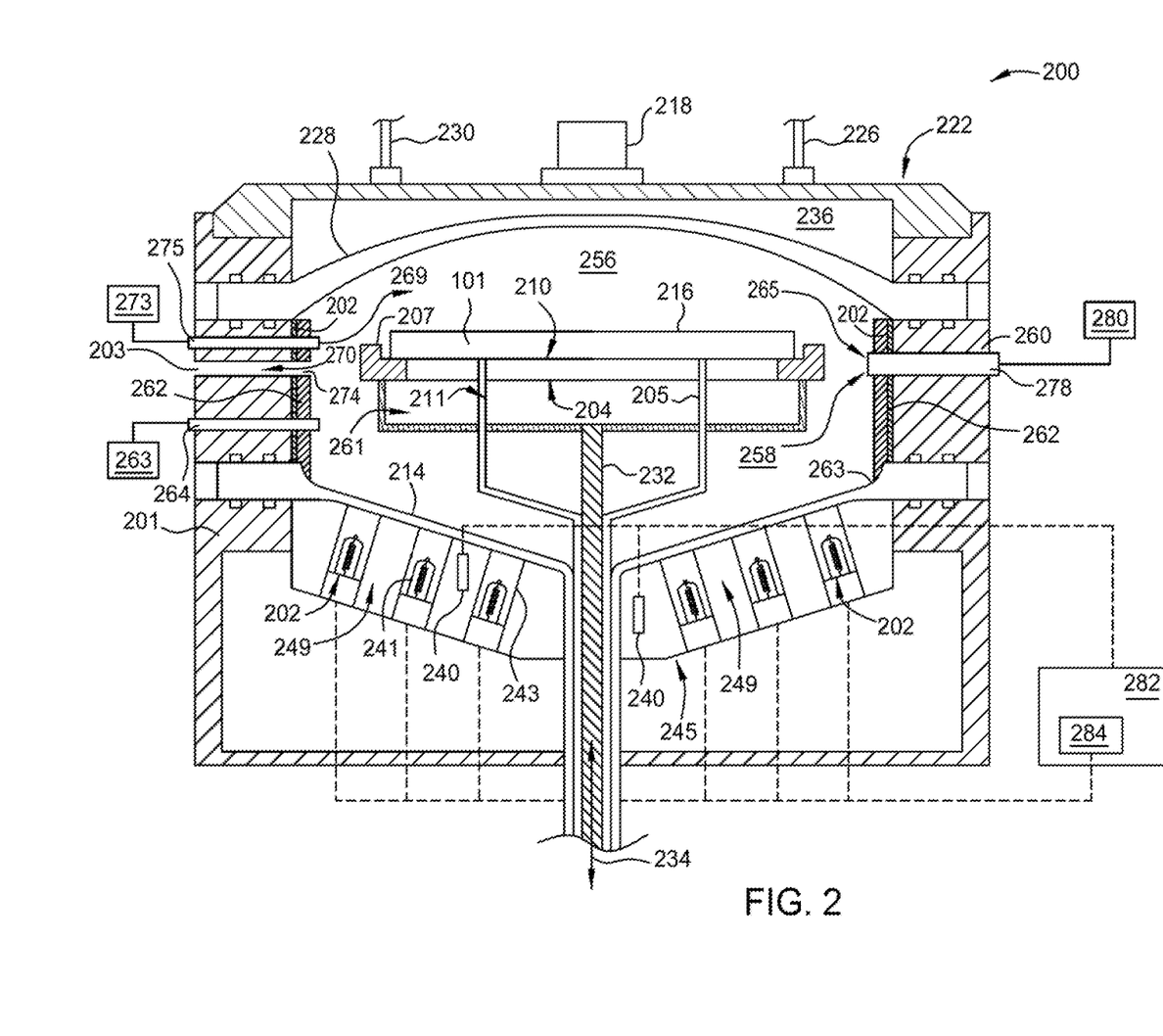
FIG. 2 depicts an apparatus may be utilized to perform an thermal annealing processing process in accordance with one embodiment of the present disclosure.

FIG. 2 is a schematic sectional view of a processing chamber 200 according to one embodiment of the disclosure. The processing chamber 200 may be used to process one or more substrates, including deposition of a material on an upper surface of a substrate, such as an upper surface 216 of a substrate 101 depicted in FIG. 2. The processing chamber 200 includes a chamber body 201 connected to, an upper dome 228 and a lower dome 214. In one embodiment, the upper dome 228 may be fabricated from a material such as a stainless steel, aluminum, or ceramics including quartz, including bubble quartz (e.g., quartz with fluid inclusions), alumina, yttria, or sapphire. The upper dome 228 may also be formed from coated metals or ceramics. The lower dome 214 may be formed from an optically transparent or translucent material such as quartz. The lower dome 214 is coupled to, or is an integral part of, the chamber body 201. The chamber body 201 may include a base plate 260 that supports the upper dome 228.

An array of radiant heating lamps 202 is disposed below the lower dome 214 for heating, among other components, a backside 204 of a substrate support 207 disposed within the processing chamber 200. During deposition, the substrate 101 may be brought into the processing chamber 200 and positioned onto the substrate support 207 through a loading port 203. The lamps 202 are adapted to the heat the substrate 101 to a predetermined temperature to facilitate thermal decomposition of process gases supplied into the processing chamber to deposit a material on onto the upper surface 216 of the substrate 101. The lamps 202 may be adapted to heat the substrate 101 to a temperature of about 300 degrees Celsius to about 1200 degrees Celsius, such as about 300 degrees Celsius to about 950 degrees Celsius.

The lamps 202 may include bulbs 241 surrounded by an optional reflector 243 disposed adjacent to and beneath the lower dome 214 to heat the substrate 101 as the process gas passes thereover to facilitate the deposition of the material onto the upper surface 216 of the substrate 101. The lamps 202 are arranged in annular groups of increasing radius around a shaft 232 of the substrate support 207. The shaft 232 is formed from quartz and contains a hollow portion or cavity therein, which reduces lateral displacement of radiant energy near the center of the substrate 208, thus facilitating uniform irradiation of the substrate 101.

In one embodiment, each lamp 202 is coupled to a power distribution board (not shown) through which power is supplied to each lamp 202. The lamps 202 are positioned within a lamphead 245 which may be cooled during or after processing by, for example, a cooling fluid introduced into channels 449 located between the lamps 202. The lamphead 245 conductively cools the lower dome 214 due in part to the close proximity of the lamphead 245 to the lower dome 214. The lamphead 245 may also cool the lamp walls and walls of the reflectors 243. If desired, the lampheads 245 may be in contact with the lower dome 214.

The substrate support 207 may be moved vertically by an actuator (not shown) to a loading position below the processing position to allow lift pins 205 to contact the lower dome 214. The lift pins 205 pass through holes 211 in the substrate support 207 and raise the substrate 101 from the substrate support 207. A robot (not shown) may then enter the processing chamber 200 to engage and remove the substrate 408 therefrom through the loading port 203. A new substrate is placed on the substrate support 207, which then may be raised to the processing position to place the substrate 101, with upper surface 216 wherein devices mostly formed thereon facing up, in contact with a front side 210 of the substrate support 207.

The substrate support 207 disposed in the processing chamber 200 divides the internal volume of the processing chamber 200 into a process gas region 256 (above the front side 210 of the substrate support 207) and a purge gas region 258 (below the substrate support 207). The substrate support 207 is rotated during processing by a central shaft 232 to minimize the effects of thermal and process gas flow spatial non-uniformities within the processing chamber 200, and thus facilitate uniform processing of the substrate 101. The substrate support 207 is supported by the central shaft 232, which moves the substrate 101 in an up and down direction 234 during loading and unloading, and in some instances, during processing of the substrate 101. The substrate support 207 may be formed from a material having low thermal mass or low heat capacity, so that energy absorbed and emitted by the substrate support 207 is minimized.

In one embodiment, the upper dome 228 and the lower dome 214 are formed from an optically transparent or translucent material such as quartz. The upper dome 228 and the lower dome 214 are thin to minimize thermal memory. In one embodiment, the upper dome 228 and the lower dome 214 may have a thickness between about 3 mm and about 10 mm, for example about 4 mm. The upper dome 228 may be thermally controlled by introducing a thermal control fluid, such as a cooling gas, through an inlet portal 226 into a thermal control space 236, and withdrawing the thermal control fluid through an exit portal 230. In some embodiments, a cooling fluid circulating through the thermal control space 236 may reduce deposition on an inner surface of the upper dome 228.

A liner assembly 262 may be disposed within the chamber body 201 and is surrounded by the inner circumference of the base plate 260. In one embodiment, the liner assembly 262 may be fabricated from an optical transparent or translucent material, such as glass, quartz, including bubble quartz (e.g., quartz with fluid inclusions), sapphire, opaque quartz, and the like. Alternatively, the liner assembly 262 may be fabricated by a metallic material, such as aluminum containing materials if the material is protected from corrosion.

An optical pyrometer 218 may be disposed at a region above the upper dome 228. The optical pyrometer 218 measures a temperature of the upper surface 216 of the substrate 101. In certain embodiments, multiple pyrometers may be used and may be disposed at various locations above the upper dome 228. A reflector 222 may be optionally placed outside the upper dome 228 to reflect infrared light that is radiating from the substrate 101 or transmitted by the substrate 101 back onto the substrate 101. Due to the reflected infrared light, the efficiency of the heating will be improved by containing heat that could otherwise escape the processing chamber 200. The reflector 222 can be made of a metal such as aluminum or stainless steel. The reflector 222 can have the inlet portal 226 and exit portal 230 to carry a flow of a fluid such as water for cooling the reflector 222. If desired, the reflection efficiency can be improved by coating a reflector area with a highly reflective coating, such as a gold coating.

A plurality of thermal radiation sensors 240, which may be pyrometers or light pipes, such as sapphire light pipes, may be disposed in the lamphead 245 for measuring thermal emissions of the substrate 101. The sensors 240 are typically disposed at different locations in the lamphead 245 to facilitate viewing (i.e., sensing) different locations of the substrate 101 during processing. In embodiments using light pipes, the sensors 240 may be disposed on a portion of the chamber body 201 below the lamphead 245. At least two sensors 240 are used, but more than two may be used.

Each sensor 240 views a zone of the substrate 101 and senses the thermal state of that zone. The zone may be oriented radially in some embodiments. For example, in embodiments where the substrate 101 is rotated, the sensors 240 may view, or define, a central zone in a central portion of the substrate 101 having a center substantially the same as the center of the substrate 101, with one or more zones surrounding the central zone and concentric therewith. It is not required that the zones be concentric and radially oriented. In some embodiments, zones may be arranged at different locations of the substrate 101 in non-radial fashion.

Process gas supplied from a process gas supply source 273 is introduced into the process gas region 256 through a process gas inlet port 275 formed in the sidewall of the base plate 260. Removal of the process gas through the gas outlet port 278 may be facilitated by a vacuum pump 280 coupled thereto. Purge gas supplied from a purge gas source 263 is introduced to the purge gas region 258 through a purge gas inlet port 264 formed in the sidewall of the base plate 260. The purge gas inlet port 264 is disposed at an elevation below the process gas inlet port 275. The purge gas inlet port 264 is configured to direct the purge gas in a generally radially inward direction. If desired, the purge gas inlet port 264 may be configured to direct the purge gas in an upward direction. During the film formation process, the substrate support 207 is located at a position such that the purge gas flows along flow path 261 across a back side 204 of the substrate support 207. Without being bound by any particular theory, the flowing of the purge gas is believed to prevent or substantially avoid the flow of the process gas from entering into the purge gas region 258, or to reduce diffusion of the process gas entering the purge gas region 258 (i.e., the region under the substrate support 207). The purge gas exits the purge gas region 258 (along flow path 266) and is exhausted out of the process chamber through the gas outlet port 278 located on the opposite side of the processing chamber 200 relative to the purge gas inlet port 264.

During processing, a controller 282 receives data from the sensors 240 and separately adjusts the power delivered to each lamp 202, or individual groups of lamps or lamp zones, based on the data. The controller 282 may include a power supply 284 that independently powers the various lamps 202 or lamp zones. The controller 282 can be configured to produce a desired temperature profile on the substrate 101, and based on comparing the data received from the sensors 240, the controller 282 may adjust the power to lamps and/or lamp zones to conform the observed (i.e., sensed) thermal data indicating of the lateral temperature profile of the substrate with to the desired temperature profile. The controller 282 may also adjust power to the lamps and/or lamp zones to conform the thermal treatment of one substrate to the thermal treatment of another substrate, to prevent chamber performance drift over time.

Figure 3:
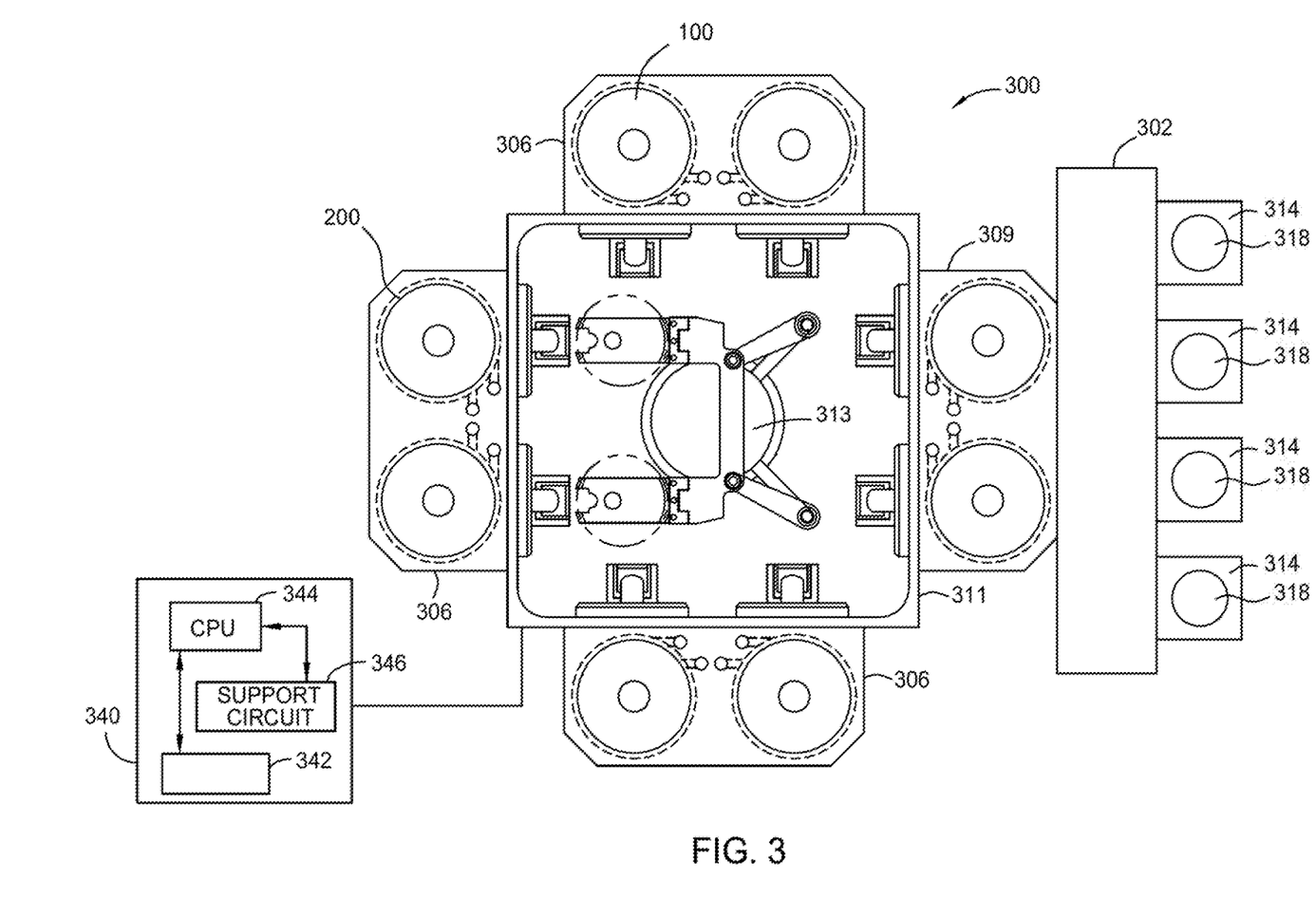
FIG. 3 depicts a schematic view of a cluster processing system that includes the apparatus of FIGS. 1 and 2.

FIG. 3 depicts a plan view of a semiconductor processing system 300 that the methods described herein may be practiced. One processing system that may be adapted to benefit from the disclosure is a 300 mm or 450 mm Producer® processing system, commercially available from Applied Materials, Inc., of Santa Clara, California. The processing system 300 generally includes a front platform 302 where substrate cassettes 318 included in FOUPs 314 are supported and substrates are loaded into and unloaded from a loadlock chamber 309, a transfer chamber 311 housing a substrate handler 313 and a series of tandem processing chambers 306 mounted on the transfer chamber 311.

Each of the tandem processing chambers 306 includes two process regions for processing the substrates. The two process regions share a common supply of gases, common pressure control, and common process gas exhaust/pumping system. Modular design of the system enables rapid conversion from one configuration to any other. The arrangement and combination of chambers may be altered for purposes of performing specific process steps. Any of the tandem processing chambers 306 can include a lid according to aspects of the disclosure as described below that includes one or more chamber configurations described above with referenced to the processing chamber 100, 200 depicted in FIG. 1 and/or FIG. 2. It is noted that the processing system 300 may be configured to perform a deposition process, etching process, curing processes, or heating/annealing process as needed. In one embodiment, the processing chambers 100, 200, shown as a single chamber designed in FIGS. 1 and 2, may be incorporated into the semiconductor processing system 300.

In one implementation, the processing system 300 can be adapted with one or more of the tandem processing chambers having supporting chamber hardware known to accommodate various other known processes such as atomic layer deposition process, chemical vapor deposition (CVD), physical vapor deposition (PVD), etching, curing, or heating/annealing and the like. For example, the system 300 can be configured with one of the processing chambers 200 in FIG. 2 as a thermal annealing process for annealing or one of the processing chambers 100 depicted in FIG. 1 as an atomic layer deposition processing chamber for selectively forming a desired material layer on a certain location of the substrate. Such a configuration can maximize research and development fabrication utilization and, if desired, eliminate exposure of films as etched to atmosphere.

A controller 340, including a central processing unit (CPU) 344, a memory 342, and support circuits 346, is coupled to the various components of the semiconductor processing system 300 to facilitate control of the processes of the present disclosure. The memory 342 can be any computer-readable medium, such as random access memory (RAM), read only memory (ROM), floppy disk, hard disk, or any other form of digital storage, local or remote to the semiconductor processing system 300 or CPU 344. The support circuits 446 are coupled to the CPU 344 for supporting the CPU in a conventional manner. These circuits include cache, power supplies, clock circuits, input/output circuitry and subsystems, and the like. A software routine or a series of program instructions stored in the memory 342, when executed by the CPU 344, executes the tandem processing chambers 306.

Figure 4:
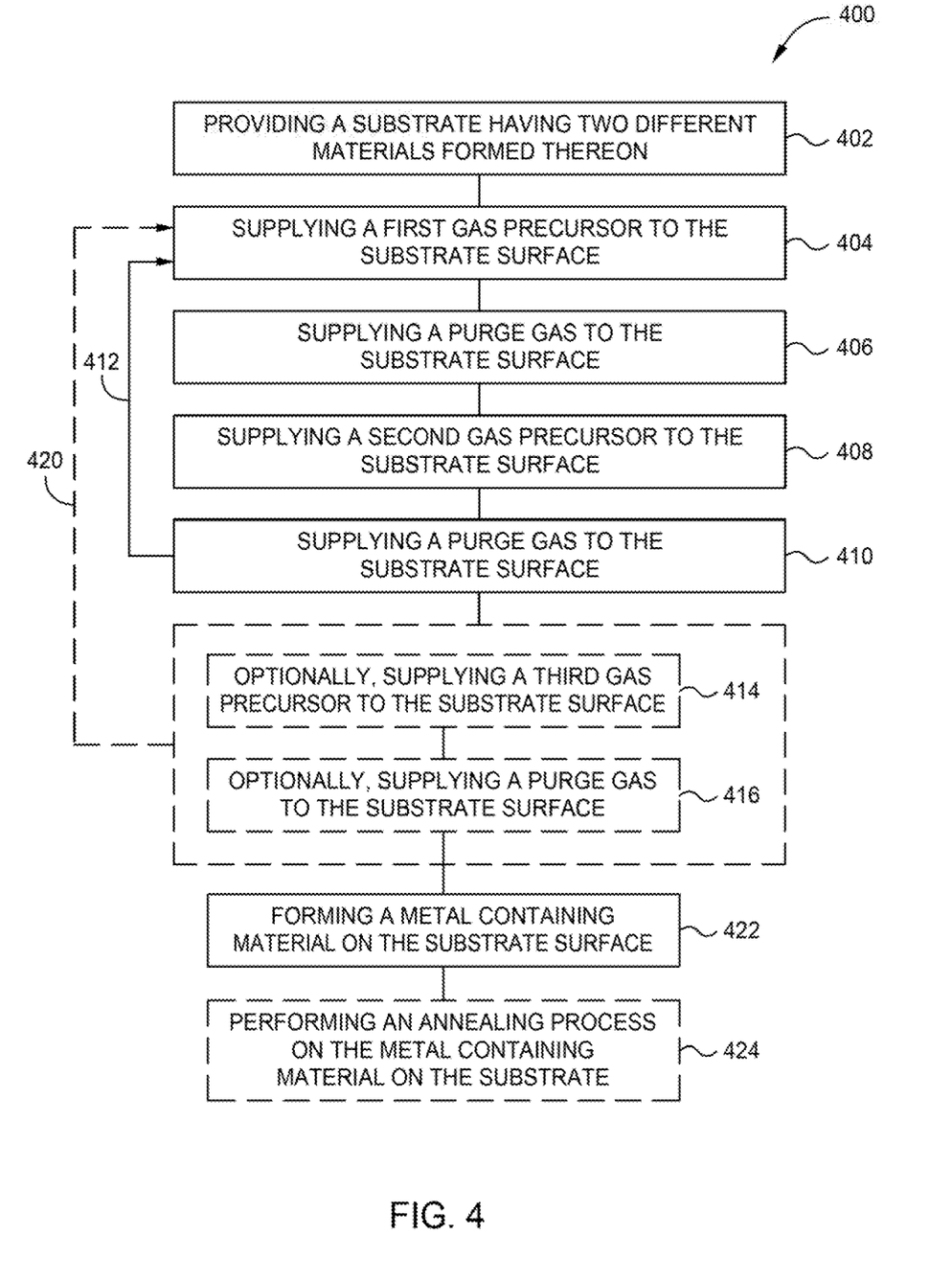
FIG. 4 depicts a flow diagram of an example of a method for selectively forming a metal containing material on certain locations on a substrate.

FIG. 4 is a flow diagram of one embodiment of a process 400 of forming a metal containing material by an atomic layer deposition (ALD) process. Such atomic layer deposition of the process 400 may be performed in the processing chamber 100 depicted in FIG. 1. The structure may be any suitable structures formed on a semiconductor substrate, such as interconnection structure with conductive and non-conductive areas, a fin structure, a gate structure, a contact structure, a front-end structure, a back-end structure or any other suitable structures utilized in semiconductor applications. FIGS. 5A-5G and FIG. 6 are schematic cross-sectional views of a portion of a composite substrate corresponding to various stages of the process 400. The process 400 may be utilized to an interconnection structure both conductive and non-conductive areas formed on a substrate so as to form a metal containing material formed on certain locations of the structure with certain materials formed on the substrate.

Figure 5A:
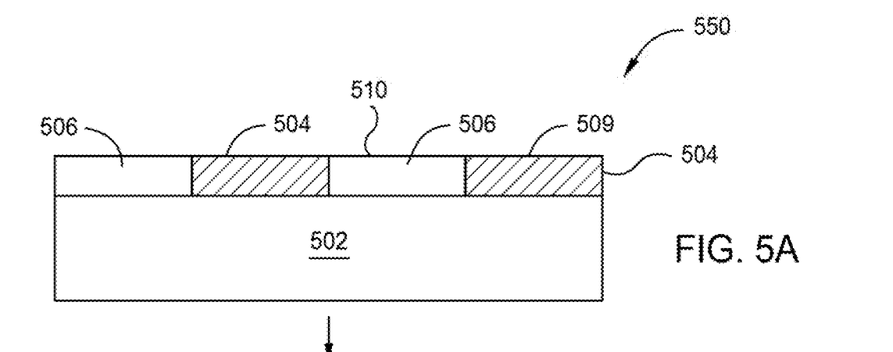
FIGS. 5A-5G depict one embodiment of a sequence for forming a metal containing material selectively on certain locations on the substrate during the manufacturing process according to the process depicted in FIG. 4.

The process 400 begins at operation 402 by providing a substrate, such as the substrate 502, as shown in FIG. 5A. In one embodiment, the substrate 502 may have a structure 550 formed on the substrate 502. In one example, the structure 550 may be utilized for forming semiconductor devices. In the example depicted in FIG. 5A, the structure 550 may include at least two different materials, such as a first material 504 and a second material 506. In one example, the first material 504 may be a silicon material or a metal material and the second material 506 may be an insulating material, such as $SiO_2$, SiON, SiN, SiOC, SiCOH, and the like. In the example wherein the first material 504 is a silicon material, the silicon material of the first material 504 may be the material from the substrate 502. Thus, the substrate 502 may be patterned to form openings that allow the second material 506 to be filled therein. The second material 506 is an insulating material comprising oxide or other suitable materials, such as $SiO_2$, SiON, SiOC, SiCOH or SiN.

In one example, the substrate 502 may include materials selected from a group consisting of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 502 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 502, the substrate 502 may include a buried dielectric layer disposed on a silicon crystalline substrate. In the embodiment depicted herein, the substrate 502 may be a crystalline silicon substrate. Moreover, the substrate 502 is not limited to any particular size or shape. The substrate 502 may be a round substrate having a 200 mm diameter, a 300 mm diameter or other diameters, such as 450 mm, among others. The substrate 502 may also be any polygonal, square, rectangular, curved or otherwise non-circular workpiece, such as a polygonal glass substrate used in the fabrication of flat panel displays.

Although the example depicted in FIG. 5A shown that the structure 550 is formed on the substrate 502, it is noted that there may be further structures formed between the interconnection structure 550 and the substrate 502 as needed. In one example, a front-end structure, such as a gate structure and/or a contact structure may be formed between the structure 550 and the substrate 502 to enable functions of the semiconductor devices.

In one example, the insulating material for the second material 506 included in the structure 550 may be a dielectric material, such as silicon oxide material, doped silicon materials, low-k material, such as carbon containing materials. Suitable carbon containing materials include amorphous carbon, SiC, SiOC, doped carbon materials or any suitable materials. Suitable examples of the low-k insulating dielectric material includes SiO containing materials, SiN containing materials, SiOC containing materials, SiC containing materials, carbon based materials, or other suitable materials.

The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed.

At operation 404, a first pulse of a first gas precursor is supplied onto the substrate surface in a processing chamber, such as the processing chamber 100 depicted in FIG. 1, to form a first monolayer 508a selectively on the first material 504 of the substrate 502, as shown in FIG. 5A. The first monolayer 508a may be a part of the metal containing material eventually desired to be formed on the substrate 502. The first monolayer 508a is selected to predominantly form the first material 504 (e.g., a silicon material or a metal material) with compatible film qualities and characteristics to the first monolayer 508a, but not to the second material 506 (e.g., an insulating material), so that the first monolayer 508a may be selectively formed on the surface 509 of the first material 504 of the substrate 502, rather than globally formed across the substrate 502, including the surfaces 510 of the second material 506.

The atomic layer deposition (ALD) process as performed for process 400 is a chemical vapor deposition (CVD) process with self-terminating/limiting growth. The ALD process yields a thickness of only a few angstroms or in a monolayer level. The ALD process is controlled by distribution of a chemical reaction into two separate half reactions which are repeated in cycles. The thickness of the metal containing material formed by the ALD process depends on the number of the reaction cycles.

The first reaction of the operation 404 provides the first monolayer 508a being absorbed on the first material 504 on the substrate 502 and a second reaction (e.g., which will be performed at operation 406) provide a second monolayer being absorbed on the first monolayer 508a. As the ALD process is very sensitive to the substrate conditions, the first monolayer 508a that forms on the first material 504 where the silicon material (or metal material) is located may not be able to adhere or form on the oxide material, such as the insulating material from the second material 506, formed on the substrate 502. Thus, by utilizing the differences of the material properties at different locations from the substrate, a selective ALD deposition process may be enabled that allows the precursors from the ALD deposition process to nucleate and grow on the nucleate sites provided from the silicon elements (or metal elements) from the first material 504, while inert to the surfaces 510 from oxide material from the second material 506.

In one example, the first gas precursor is a metal containing precursor, which is utilized to provide metal elements to form a metal containing material on the substrate 502. Thus, the first monolayer 508a as formed on the first material 504 is a metal material. The metal elements sourced from the first gas precursor is selected to be easily absorbed and attached to the silicon elements (or metal elements) from the first material 504 from the substrate 502. Thus, the selective ALD deposition process selectively grow the first monolayer 508a comprising metal elements on designated sites only, i.e., the silicon materials or metal materials form the first material 504, without forming on the non-silicon or non-metal material (e.g., oxide material or insulating material) from the second material 506.

During the ALD deposition process, a pulse of a first gas precursor (e.g., a first reactant) is supplied into the processing chamber, such as the processing chamber 100 depicted in FIG. 1, to form the first monolayer 508a. It is believed that the first monolayer 508a is absorbed onto the first material 504 by a chemical reaction that allows the metal atoms from the first monolayer 508a to be securely adhered on the silicon or metal atoms from the first material 504. Since the metal elements from the first monolayer 508a may have chemical properties different from the oxide material from the second material 506, the molecules from the second material 506 may not be able to successfully adhere the metal atoms from the first monolayer 508a, thus selectively allowing the metal atoms from the first monolayer 508a to be adhered on the silicon or metal atoms of the first material 504. In this way, the subsequently formed second monolayer (e.g., 512a shown in FIG. 5C) may selectively deposit on the first monolayer 508a, thus enabling a continuing selective deposition of an ALD process.

In one example, the first gas precursor (e.g., a first reactant) utilized in the first pulse of reaction to form the first monolayer 508a includes metal containing gas precursor, such as a molybdenum (Mo) containing gas precursor. Suitable examples of the molybdenum (Mo) containing gas precursor include molybdenum hexafluoride ($MoF_6$), $Mo(NMe_2)_4$, $MoCl_5$, $MoCl_6$, $Mo(CO)_6$, $(C_6H_6)Mo(CO)_3$, $(C_6H_3Me_3)Mo(CO)_3$, $(Ph[^tBu]N)_3Mo$ and $Mo(allyl)_4$ and the like.

Strong adherence of atoms in each layers and absorbability of the layers of atoms onto the surface of substrate provide compact and secured bonding structures so as to render a film property with a high film density and high selectivity (compared to a chemical vapor deposition process).

The first pulse of reaction sourced from the first gas precursor at operation 402 lasts for a predetermined time interval. The term pulse as used herein refers to a dose of material injected into the process chamber. During pulsing of the first gas precursor, several process parameters are also regulated. In one embodiment, the process pressure is controlled at between about 0.01 Torr and about 20 Torr.

The processing temperature is maintained less than 150 degrees Celsius, such as between about 40 degrees Celsius and about 130 degrees Celsius, such as about 120 degrees Celsius. It is believed that the relatively low deposition temperature, such as less than 150 degrees Celsius, may assist gradually and slowly adhering the elements onto the selected type of the material on the substrate to achieve deposition selectivity. Furthermore, the relatively low deposition temperature prevents thermal decomposition which will lead to non-selective deposition across the global surface of the substrate. The relatively low deposition temperature also prevents desorption of surface species from the second material 506 that could leave reactive dangling bonds.

Figure 5B:
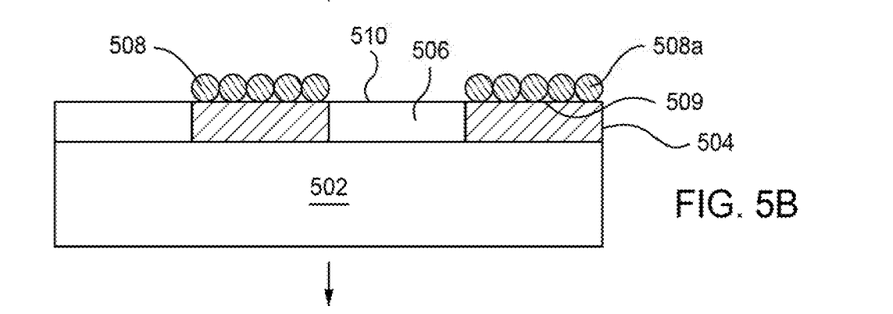

Thus, the first monolayer 508a shown in FIG. 5B may include Mo elements, after the first pulse of the first gas precursor. Each pulse of the first reaction may deposit the first monolayer 508a having a thickness between about 1 Å and about 5 Å.

At operation 406, after pulsing of the first gas precursor, a purge gas may be supplied to the substrate surface. Between each pulse of the first precursor or/and a second precursor (which will be later performed at operation 408) and/or a reactive gaseous species, a purge gas or a purge gas mixture, such as a nitrogen gas, an inert gas (e.g., He or Ar) or the like, may be pulsed into the processing chamber in between each or multiple pulses of the first precursor or/and a second precursor and/or a reactive gaseous species to remove the by-products, impurities or residual precursor gas mixture which is unreacted/non-absorbed by the substrate surface (e.g., unreacted impurities from the reactant gas mixture or others) so they can be pumped out of the processing chamber.

The process parameters controlled during the operation 406 for pulsing the purge gas and/or purge gas mixture may be controlled similar to or the same as the pulsing of the first gas mixture at operation 404.

Figure 5C:
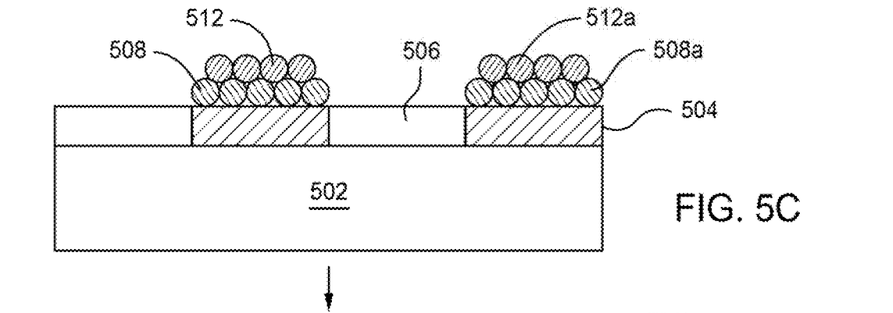

At operation 408, after the first reaction and a pump/purge process, a second gas precursor (e.g., a second reactant or called a co-reactant) is supplied to initiate a second reaction, forming a second monolayer 512a on the first monolayer 508a, as shown in FIG. 5C. The second precursor may be supplied with or without additional reactive gaseous species as needed. The second precursor is a silicon containing precursor. Suitable examples of the silicon containing precursor include $SiH_4$, $Si_2H_6$, $SiCl_4$, $SiF_4$, TEOS and the like. In one example, the silicon containing gas is $SiH_4$ or $Si_2H_6$. The pulse of the second gas precursor initiate a second reaction which may deposit the second monolayer 512a having a thickness between about 1 Å and about 3 Å.

It is believed that the silicon elements provided from the second precursor may react with the metal elements from the first monolayer 508a, forming a metal and silicon containing material selectively on the first material 504. The silicon element tends to have a relatively higher reactivity to the first monolayer 508a than from the surface 510 of the second material 506, as the metal elements from the first monolayer 508a contain reactive bonds or ligands that can be displaced. Thus, the silicon elements supplied from the second gas precursor reacts with the metal elements from the first monolayer 508a, rather than adhered onto the surface 510 of the second material 506, thus rendering and enabling the continuation of the selective deposition process.

The second reaction lasts for a predetermined time interval to form the second monolayer 512a. During pulsing of the second precursor comprising silicon containing precursor, a reactive gaseous species may be supplied simultaneously with, alternatively, or sequentially with the second precursor (e.g., the Si containing precursor as one example) as need prior to, during or after the pulsing of the second gas precursor.

During supplying of the second precursor with or without the reactive gaseous species (e.g., the reactive gaseous species supplied after the first precursor), several process parameters are also regulated. In one embodiment, the process pressure is controlled at between about 0.01 Torr and about 10 Torr.

The processing temperature is maintained less than 150 degrees Celsius, such as between about 40 degrees Celsius and about 130 degrees Celsius, such as about 120 degrees Celsius. It is believed that the relatively low deposition temperature, such as less than 150 degrees Celsius, may assist gradually and slowly adhering the elements onto the selected type of the material on the substrate to achieve deposition selectivity. Furthermore, the relatively low deposition temperature prevents thermal decomposition which will lead to non-selective deposition across the global surface of the substrate. The relatively low deposition temperature also prevents desorption of surface species from the second material 506 that could leave reactive dangling bonds.

Thus, the first monolayer 508a and the second monolayer 512a as shown in FIG. 5C may include Mo elements as well as silicon elements, after the second pulse of the second precursor.

At operation 410, after pulsing of the second gas precursor, a purge gas may be supplied to the substrate surface. Between each pulse of the first precursor or/and a second precursor (which will be later performed at operation 408) and/or a reactive gaseous species, a purge gas or a purge gas mixture, such as a nitrogen gas, an inert gas (e.g., He or Ar) or the like, may be pulsed into the processing chamber in between each or multiple pulses of the first precursor or/and a second precursor and/or a reactive gaseous species to remove the by-products, impurities or residual precursor gas mixture which is unreacted/non-absorbed by the substrate surface (e.g., unreacted impurities from the reactant gas mixture or others) so they can be pumped out of the processing chamber.

The process parameters controlled during the operation 410 for pulsing the purge gas and/or purge gas mixture may be controlled similar to or the same as the pulsing of the first gas precursor or the second gas precursor at operation 404 and 408 respectively.

Figure 5D:
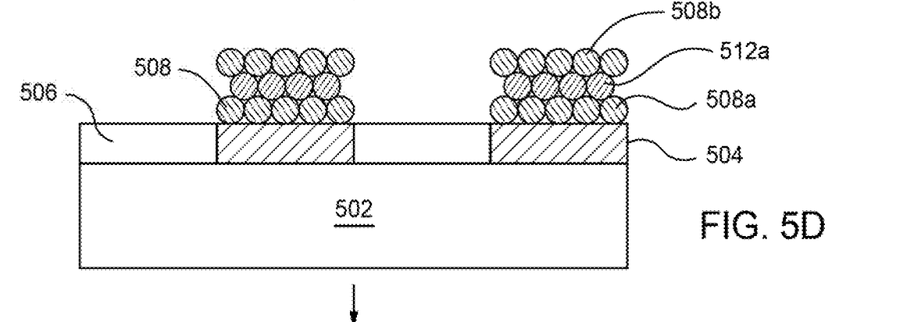
Figure 5E:
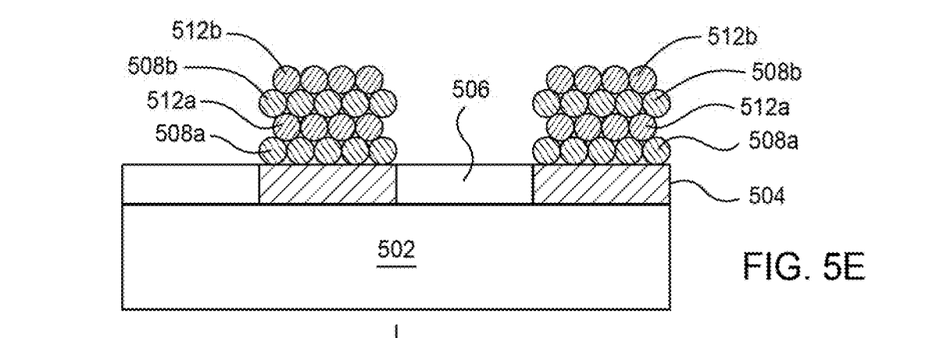
Figure 5F:
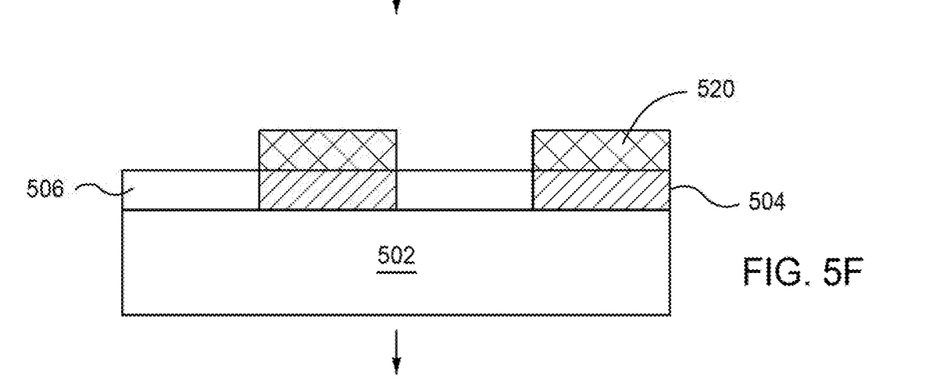

It is noted that the first reaction at operation 404 and the second reaction at operation 408 (and the purge processes at operation 406 and 410) may be repeatedly performed, as indicated by the loop 412, forming an additional first monolayer 508b, as shown in FIG. 5D and yet another additional second monolayer 512b, as shown in FIG. 5E, until a desired thickness of the overall metal containing layer 520 is reached, as shown in FIG. 5F. It is noted that the element/atom scale shown in FIGS. 5B-5E may be exaggerated for ease of explanation.

Figure 6:
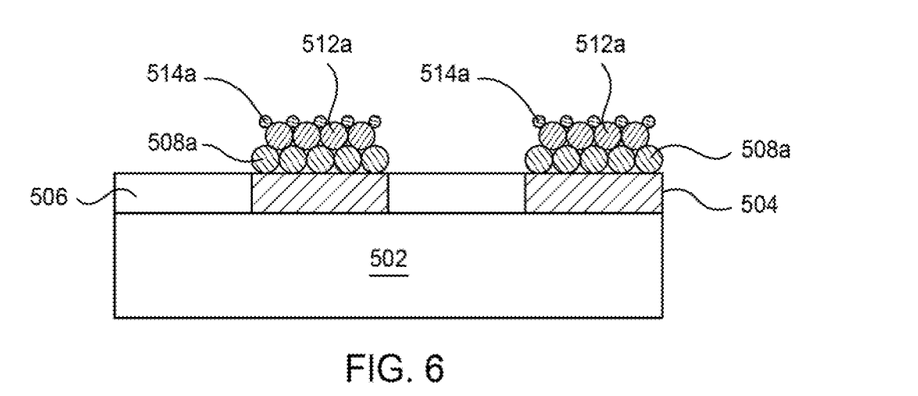
FIG. 6 depict another embodiment of a metal containing material selectively on certain locations on the substrate during the manufacturing process according to the process depicted in FIG. 4.

Alternatively, in an optional example, after operation 410, the process 400 may further proceed to operation 414 by supplying a third gas precursor to the substrate surface. The third gas precursor (e.g., a third reactant or called a co-reactant) is supplied to initiate a third reaction, forming a third monolayer 514a on the second monolayer 512a, as shown in FIG. 6. The third gas precursor may be supplied with or without additional reactive gaseous species as needed. The third precursor is an oxygen containing precursor. In one example, suitable examples of the oxygen containing precursor include $H_2O$, $O_2$, $O_3$, $CO_2$, $H_2O_2$, $NO_2$, $N_2O$, and the like. The oxygen containing gas is $O_2$ or $O_3$. The pulse of the third gas precursor initiates the third reaction which may deposit the third monolayer 514a having a thickness between about 1 Å and about 3 Å.

Similarly, it is believed that the oxygen elements provided from the third gas precursor may react with the metal elements from the first monolayer 508a and the silicon elements from the second monolayer 512a, forming a metal and silicon containing oxide material selectively on the first material 504. The oxygen element tends to have a relatively higher reactivity to the first and the second monolayers 508a, 512a than from the surface 510 of the second material 506, as the metal and silicon elements from the first and second monolayer 508a, 512a are at an excited and activated state. Thus, the oxygen elements supplied from the third gas precursor reacts with the metal and silicon elements from the first and second monolayer 508a, 512a, rather than adhered onto the surface 510 of the second material 506, thus rendering a selective deposition process.

The third reaction initiated from the third gas precursor at operation 414 may be similarly performed as the first and the second reactions at operation 404 and 408.

Similarly, followed by operation 414, an optional pump/purge process at operation 416 may also be performed to remove the surface residuals, excess reactive species and the like. The pump/purge process at operation 416 is similarly controlled or the same as the pump/purge process controlled at operations 406, 410.

It is noted that the first reaction at operation 404, the second reaction at operation 408 and the third reaction at operation 414 (and the purge processes at operation 406, 410 and 416) may be repeatedly performed, as indicated by the loop 420, forming an additional first monolayer 508b, additional second monolayer 512b, and additional third monolayer until a desired thickness of the overall metal containing layer 520 is reached, as shown in FIG. 5F. It is noted that the element/atom scale shown in FIG. 6 may be exaggerated for ease of explanation.

In the embodiment wherein the operations 414, 416 are not performed, the operation 422 may be performed subsequent to the operation 410.

At operation 422, as discussed above, when a desired thickness (e.g., a predetermined number of cycles among operations 404 to 410, or a predetermined number of cycles among operations 404 to 416) is reached, the metal containing layer 520 is selectively formed on the first material 504, as shown in FIG. 5F. The metal containing layer 520 has a thickness range from 10 Å and about 100 Å. As discussed above, based on the number of the cycles among the selected operations, composition of the resultant metal containing layer 520 may be different. For example, the metal containing layer 520 may be a MoSi layer when the process 400 is predominately performed by the loop 412 among operations 404 to 410. Alternatively, the metal containing layer 520 may be a MoSiO layer when the process 400 is predominately performed by the loop 420 among operations 404 and 416. Furthermore, based on different film property requirements, the operations as selected to perform may be altered or adjusted to render the metal containing layer 520 with different ratios of the elements among molybdenum, silicon and/or oxygen. For example, if additional elements are desired, an additional gas precursor, such as a fourth gas precursor and so on, may be used to introduce additional elements to the metal containing layer 520 as needed.

Figure 5G:
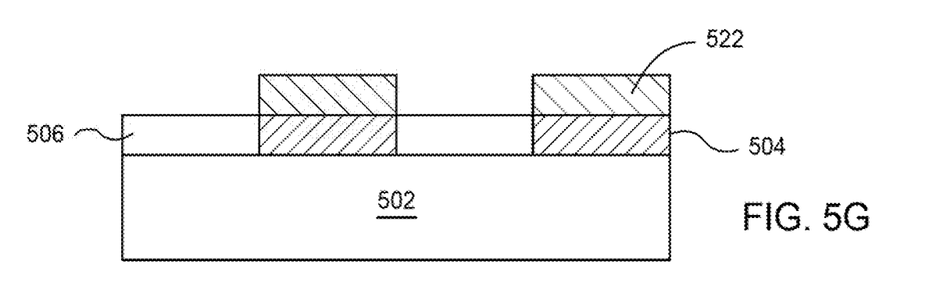

At operation 424, optionally, an annealing process may be performed to thermally treat the metal containing layer 520, forming a treated metal containing layer 522 selectively on the first material 504, as shown in FIG. 5G. During the annealing process, additional reacting gas may be supplied to incorporate further elements into the metal containing layer 520. For example, during an annealing process, oxygen elements may be introduced and doped into the metal containing layer 520 as needed. In the example wherein the process 400 is performed utilizing the loop 412 between operation 404 to operation 410, a third element, if desired, may be introduced, incorporated, or doped into the metal containing layer 520 by the annealing process at operation 424 to form the treated metal containing layer 522.

The annealing process at operation 424 is performed to incorporate additional dopants or elements into the metal containing layer 520 as well as repair, densify and enhance the bonding structures of the metal containing layer 520, forming the treated metal containing layer 522 with different components and lattice structures. For example, when two elements (e.g., Mo and silicon elements) are formed in the metal containing layer 520 (e.g., formed from the loop 412 of operations 404-410), the annealing process at operation 424 may assist incorporating the third element (e.g., oxygen elements) into the metal containing layer 520, forming the treated metal containing layer 522 (e.g., a MoSiO layer).

Furthermore, the annealing process may also assist removing impurities from the metal containing layer 520.

The thermal annealing process may be performed in a thermal annealing chamber, such as the processing chamber 200 depicted in FIG. 2. Alternatively, the thermal annealing process may be performed at the ALD processing chamber 100, as depicted in FIG. 1, followed by the metal containing layer ALD deposition process without breaking vacuum. Alternatively, the annealing process may be performed in any processing chamber configured to provide enough thermal energy to metal containing layer 520. The thermal annealing process may heat the substrate 502 to a temperature greater than 200 degrees Celsius, such as between about 250 degrees Celsius and about 400 degrees Celsius, for example between about 350 degrees Celsius.

During annealing, an annealing gas mixture (or an additional reacting gas) may be supplied. Gases that may be supplied in the annealing gas mixture may include an oxygen containing gas, such as $O_2$, $N_2O$, $NO_2$, NO, $O_3$ and the like. In the example wherein additional elements are not necessarily required, a nitrogen containing gas, such as $NH_3$, $N_2$, and the like, an inert gas, such as Ar, He, Ne, Kr, Xe or the like, may be utilized to assist providing thermal energy to the metal containing layer 520.

In some examples, the thermal annealing process performed at operation 424 may be a rapid thermal annealing process, laser annealing process, furnace annealing process or any suitable thermal annealing process as needed.

In one example, after the thermal annealing process at operation 424, some impurities or byproduct, such as F elements from the first gas precursor, or carbon elements from the ambient embodiment, may be driven out, so as to increase the crystallinity structure or density of the resultant treated metal containing layer 522 by removing undesired elements from the film structure.

Figure 7:
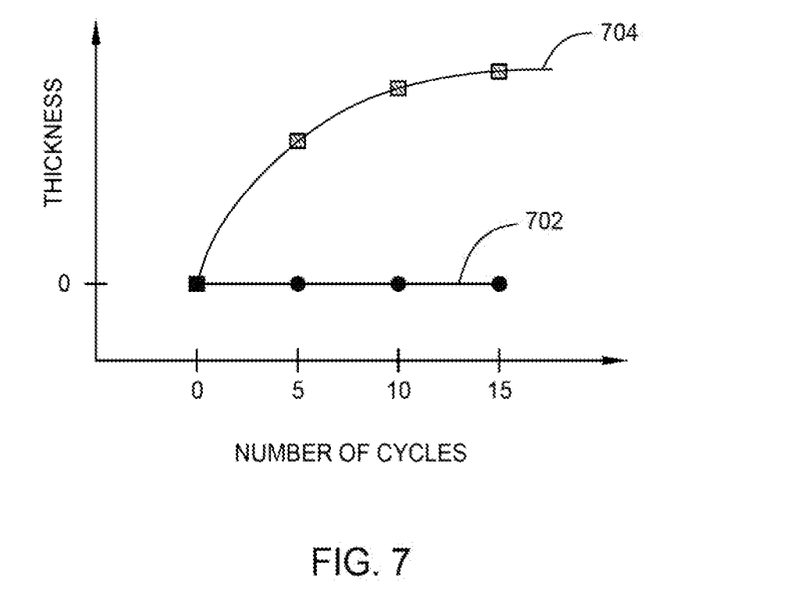
FIG. 7 depicts a thickness variation over time of a metal containing material disposed on different locations of the substrate with different materials.

FIG. 7 depicts a thickness variation over numbers of the cycle pf precursor pulses performed to form the metal containing layer 520 on different locations with different materials from the substrate 502. The thickness of the metal containing layer 520 grown on the first material 504 is shown by the trace line 704 while the thickness of the metal containing layer 520 grown on the second material 506 is shown by the trace line 702. As indicated by the trace line 704, with the increase of the numbers of the cycles from operation 404 to 410, or from operation 404 to operation 416, the metal containing layer 520 formed on the first material 504 is steadily grown and increased while with minimum growth on the second material 506, as shown in the trace line 702. Thus, the metal containing layer 520 is selectively and predominately formed on the first material 504, such as a silicon material, rather than on the second material 506, such as $SiO_2$, SiN, SiON, SiOC, SiOCH and the like.

Thus, a selective deposition process is provided to a metal containing layer on different surfaces, e.g., different portions, of a substrate by a selective ALD process. Thus, a structure with desired different type of materials formed on different locations of the substrate may be obtained.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a metal containing material on a substrate comprising:
   pulsing a first gas precursor comprising a metal containing precursor to a surface of a substrate;
   pulsing a second gas precursor comprising a silicon containing precursor to the surface of the substrate;
   forming a metal containing material selectively on a first material of the substrate, wherein the metal containing layer is a MoSiO layer; and
   thermal annealing the metal containing material formed on the substrate.

2. The method of claim 1, wherein the first and second gas precursors are alternatively supplied.

3. The method of claim 1, further comprising:
   supplying a third gas precursor comprising an oxygen containing gas to the surface of the substrate.

4. The method of claim 3, wherein the oxygen containing gas is 02.

5. The method of claim 1, wherein the substrate comprises the first material and a second material different from the first material.

6. The method of claim 5, wherein the first material is a silicon material or a metal material.

7. The method of claim 5, wherein the second material is an insulating material.

8. The method of claim 7, wherein the insulating material is at least one of $SiO_2$, SiON, SiN, SiOC and SiOCH.

9. The method of claim 1, wherein the metal containing precursor comprises molybdenum (Mo).

10. The method of claim 9, wherein the metal containing precursor is at least one of molybdenum hexafluoride ($MoF_6$), $Mo(NMe_2)_4$, $MoCl_5$, $MoCl_6$, $Mo(CO)_6$, $(C_6H_6)Mo(CO)_3$, $(C_6H_3Me_3)Mo(CO)_3$, $(Ph[^tBu]N)_3Mo$ and $Mo(allyl)_4$.

11. The method of claim 1, wherein the silicon containing precursor is $SiH_4$ or $Si_2H_6$.

12. The method of claim 1, wherein thermal annealing the metal containing material further comprises:
   maintaining a substrate temperature greater than 250 degrees Celsius.

13. The method of claim 1, wherein thermal annealing the metal containing material further comprises:
   incorporating an additional element into the metal containing material.

14. The method of claim 1, wherein a purge gas is pulsed between pulsing of the first gas precursor and the second gas precursor.

15. A method of forming a metal containing material on a substrate comprising:
   performing an atomic layer deposition process by alternatively pulsing a first and a second gas precursor to a surface of a substrate comprising a first and a second material, wherein the first gas precursor comprises a metal containing gas;
   selectively forming a metal containing material on the first material of the substrate, wherein the metal containing layer is a MoSiO layer; and
   thermally annealing the metal containing material.

16. The method of claim 15, wherein the metal containing gas is at least one of molybdenum hexafluoride ($MoF_6$), $Mo(NMe_2)_4$, $MoCl_5$, $MoCl_6$, $Mo(CO)_6$, $(C_6H_6)Mo(CO)_3$, $(C_6H_3Me_3)Mo(CO)_3$, $(Ph[^tBu]N)_3Mo$ and $Mo(allyl)_4$.

17. The method of claim 15, further comprising:
   maintaining a substrate temperature less than 150 degrees Celsius while performing the atomic layer deposition process.

18. A method of forming a metal containing material on a substrate comprising:
   selectively forming a metal containing layer on a silicon material on a substrate than on an insulating material on the substrate by an atomic layer deposition process, wherein the metal containing layer is a MoSiO layer; and
   maintaining a substrate temperature less than 150 degrees Celsius while performing the atomic layer deposition process.

\* \* \* \* \*